(12) United States Patent
Wang et al.

(10) Patent No.: US 10,923,206 B2
(45) Date of Patent: Feb. 16, 2021

(54) SHIFT REGISTER UNIT FOR DISPLAY AND DRIVING METHOD THEREOF, GATE DRIVING DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Zhen Wang, Beijing (CN); Jian Sun, Beijing (CN); Yun Qiao, Beijing (CN); Xiaozhou Zhan, Beijing (CN); Fei Huang, Beijing (CN); Han Zhang, Beijing (CN); Wenwen Qin, Beijing (CN); Lele Cong, Beijing (CN); Zhengkui Wang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 58 days.

(21) Appl. No.: 15/760,294

(22) PCT Filed: Sep. 19, 2017

(86) PCT No.: PCT/CN2017/102243
§ 371 (c)(1),
(2) Date: Mar. 15, 2018

(87) PCT Pub. No.: WO2018/141158
PCT Pub. Date: Aug. 8, 2018

(65) Prior Publication Data
US 2020/0051654 A1 Feb. 13, 2020

(30) Foreign Application Priority Data
Feb. 6, 2017 (CN) .......................... 201710065761.9

(51) Int. Cl.
*G11C 19/28* (2006.01)
*G09G 3/20* (2006.01)

(52) U.S. Cl.
CPC ............... *G11C 19/28* (2013.01); *G09G 3/20* (2013.01)

(58) Field of Classification Search
None
See application file for complete search history.

(56) References Cited

U.S. PATENT DOCUMENTS

2014/0055442 A1 2/2014 Hsu et al.
2015/0318052 A1* 11/2015 Li .......................... G11C 19/28
377/64

(Continued)

FOREIGN PATENT DOCUMENTS

CN 104036738 A 9/2014
CN 106896957 A 6/2017

OTHER PUBLICATIONS

PCT International Search Report, Application No. PCT/CN2017/102243, dated Dec. 5, 2017, 7 pages.: with English translation.

(Continued)

*Primary Examiner* — David D Davis
(74) *Attorney, Agent, or Firm* — Armstrong Teasdale LLP

(57) ABSTRACT

The embodiments of the present disclosure relate to a shift registers unit and a driving method thereof, and a gate driving device. The shift register unit includes a first and second input circuit, a pull-down control circuit, an output circuit, a pull-down circuit, and a control circuit. The first input circuit provides a first control signal to a pull-up node. The second input circuit provides a second control signal to the pull-up node. The pull-down control circuit provides the voltage of a first voltage terminal to a pull-down node, or controls the voltage of the pull-down node. The output circuit provides a second clock signal to a signal output (Continued)

terminal. The pull-down circuit provides the voltage of the first voltage terminal to the pull-up node and the signal output terminal. The control circuit provides the first input signal to the pull-up node.

18 Claims, 5 Drawing Sheets

(56) References Cited

U.S. PATENT DOCUMENTS

| | | | | |
|---|---|---|---|---|
| 2016/0049126 A1* | 2/2016 | Zhang | ............... | G08G 3/3648 |
| | | | | 345/173 |
| 2016/0275849 A1* | 9/2016 | Tsai | ............... | G09G 3/3677 |
| 2016/0293094 A1* | 10/2016 | Park | ............... | H03K 17/6871 |
| 2016/0307641 A1* | 10/2016 | Zheng | ............... | G09G 3/3677 |
| 2016/0358566 A1* | 12/2016 | Li | ............... | G11C 19/28 |
| 2016/0358666 A1* | 12/2016 | Pang | ............... | G11C 19/287 |
| 2017/0010731 A1* | 1/2017 | Zhang | ............... | G11C 19/28 |
| 2017/0221441 A1* | 8/2017 | Gu | ............... | G06F 3/0412 |

OTHER PUBLICATIONS

PCT Written Opinion, Application No. PCT/CN2017/102243, dated Dec. 5, 2017, 10 pages.: with English translation.

* cited by examiner

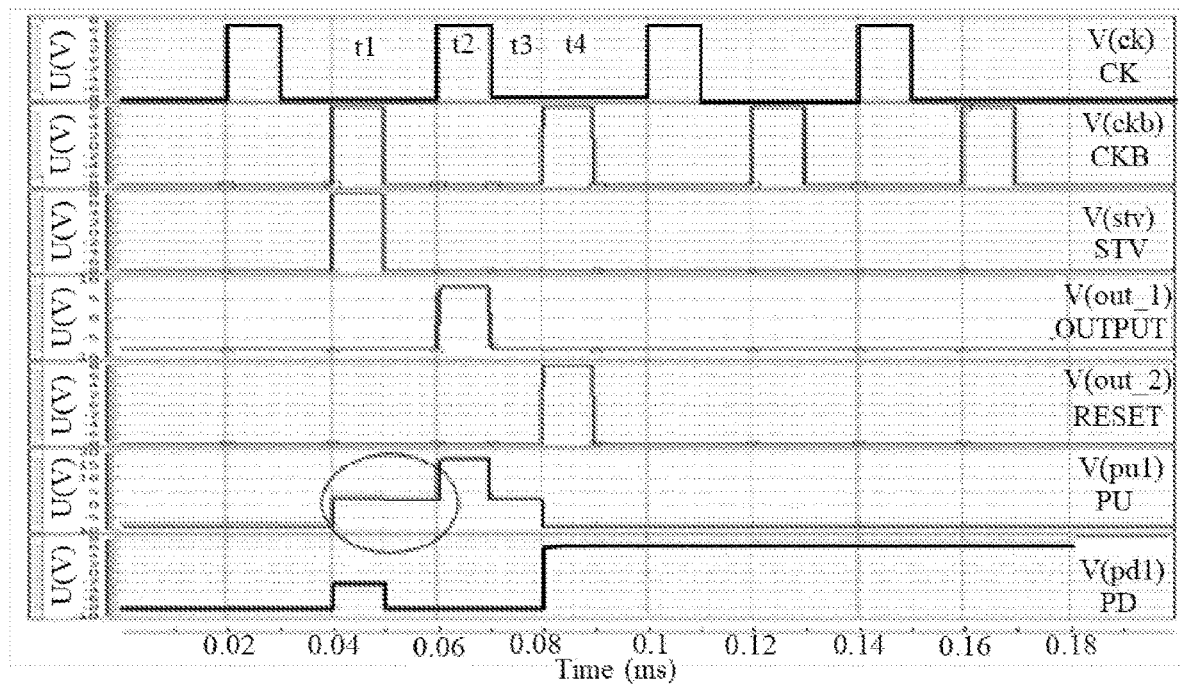

Fig. 5

| turning on a first input circuit according to a first input signal, so as to provide a first control signal to a pull-up node, turning on a control circuit according to the first control signal and a first clock signal, so as to provide the first input signal to the pull-up node, and turning on an output circuit according to the voltage of the pull-up node, so as to output a second clock signal to a signal output terminal | — S610 |

↓

| maintaining the voltage of the pull-up node to keep the output circuit turned on, so as to output the second clock signal to the signal output terminal, and controlling the voltage of a pull-down node by a pull-down control circuit according to the voltage of the pull-up node | — S620 |

↓

| turning on a second input circuit according to a second input signal, so as to provide a second control signal to the pull-up node to turn off the output circuit, and providing the first clock signal to the pull-down node according to the first clock signal to turn on a pull-down circuit, so as to provide the voltage of a first voltage terminal to the pull-up node and the signal output terminal | — S630 |

Fig. 6

SHIFT REGISTER UNIT FOR DISPLAY AND DRIVING METHOD THEREOF, GATE DRIVING DEVICE

CROSS REFERENCE TO RELATED APPLICATIONS

This patent application is a National Stage Entry of PCT/CN2017/102243 filed on Sep. 19, 2017, which claims the benefit and priority of Chinese Patent Application No. 201710065761.9 filed on Feb. 6, 2017, the disclosures of which are incorporated herein by reference in their entirety as part of the present application.

BACKGROUND

Embodiments of the present disclosure relate to the field of display control technologies, and in particular, to a shift register unit and a driving method thereof, a gate driving device, an array substrate, a display device and an electronic device.

With the development of display technologies, compared with conventional liquid crystal display (LCD) devices, a new generation of organic light emitting diode (OLED) display device has the advantages of lower manufacturing costs, a faster response speed, higher contrast, a wider viewing angle, a larger operating temperature range, no backlight unit, brighter colors, light weight, thin size and so on. Hence, the OLED display technology has become the fastest growing display technology.

In order to increase process integration of an OLED panel and reduce costs, a gate driver on array (GOA) technology is commonly used to integrate a gate switching circuit of a thin film transistor (TFT) on an array substrate of a display panel, to achieve scanning driving of the display panel. Such gate driving circuit integrated on the array substrate using the GOA technology is also called a GOA circuit or a shift register circuit. It reduces material and manufacturing costs by employing a display device with a GOA circuit, because of the omission of the part bound with the driving circuit.

BRIEF DESCRIPTION

An embodiment of the present disclosure provides a shift register unit and a driving method thereof, a gate driving device, an array substrate, a display device and an electronic device. It can effectively increase voltage of a pull-up node PU in a stage of the GOAs which needs to be activated after a Touch on a display panel is ended, with the shift register unit, thereby solving the problem of insufficient charging of TFTs in a pixel region.

An aspect of the present disclosure provides a shift register unit, including a first input circuit, a second input circuit, a pull-down control circuit, an output circuit, a pull-down circuit, and a control circuit. The first input circuit is configured to provide a first control signal from a first signal control terminal to a pull-up node according to a first input signal from a first signal input terminal. The second input circuit is configured to provide a second control signal from a second signal control terminal to the pull-up node according to a second input signal from a second signal input terminal. The pull-down control circuit is configured to provide a voltage of a first voltage terminal to a pull-down node according to a voltage of the pull-up node, or to control a voltage of the pull-down node according to a first clock signal from a first clock signal input terminal. The output circuit is configured to provide a second clock signal from a second clock signal input terminal to a signal output terminal as an output signal according to the voltage of the pull-up node. The pull-down circuit is configured to provide the voltage of the first voltage terminal to the pull-up node and the signal output terminal according to the voltage of the pull-down node. The control circuit is configured to provide the first input signal to the pull-up node according to the first control signal and the first clock signal.

In an embodiment of the present disclosure, the control circuit includes a second transistor and a third transistor. A control electrode of the second transistor is coupled to the first signal control terminal, a first electrode of the second transistor is coupled to the second electrode of the third transistor, and a second electrode of the second transistor is coupled to the first signal input terminal. A control electrode of the third transistor is coupled to the first clock signal input terminal, a first electrode of the third transistor is coupled to the pull-up node, and a second electrode of the third transistor is coupled to the first electrode of the second transistor.

In an embodiment of the present disclosure, the control circuit is further configured to provide the second input signal to the pull-up node according to the second control signal and the first clock signal.

In an embodiment of the present disclosure, the control circuit includes a fifth transistor and a sixth transistor. A control electrode of the fifth transistor is coupled to the second signal control terminal, a first electrode of the fifth transistor is coupled to the second signal input terminal, and a second electrode of the fifth transistor is coupled to the first electrode of the sixth transistor. A control electrode of the sixth transistor is coupled to the first clock signal input terminal, a first electrode of the sixth transistor is coupled to the second electrode of the fifth transistor, and a second electrode of the sixth transistor is coupled to the pull-up node.

In an embodiment of the present disclosure, the first input circuit includes a first transistor. A control electrode of the first transistor is coupled to the first signal input terminal, a first electrode of the first transistor is coupled to the pull-up node, and a second electrode of the first transistor is coupled to the first signal control terminal.

In an embodiment of the present disclosure, the second input circuit includes a fourth transistor. A control electrode of the fourth transistor is coupled to the second signal input terminal, a first electrode of the fourth transistor is coupled to the second signal control terminal, and a second electrode of the fourth transistor is coupled to the pull-up node.

In an embodiment of the present disclosure, the pull-down control circuit includes a seventh transistor, a ninth transistor, a tenth transistor, and a second capacitor. A control electrode and a second electrode of the seventh transistor are coupled to the first clock signal input terminal, and a first electrode of the seventh transistor is coupled to the pull-down node. A control electrode of the ninth transistor is coupled to the pull-up node, a first electrode of the ninth transistor is coupled to the first voltage terminal, and a second electrode of the ninth transistor is coupled to the pull-down node. A control electrode of the tenth transistor is coupled to the signal output terminal, a first electrode of the tenth transistor is coupled to the first voltage terminal, and a second electrode of the tenth transistor is coupled to the pull-down node. The second capacitor is coupled between the pull-down node and the first voltage terminal.

In an embodiment of the present disclosure, the output circuit includes a twelfth transistor and a first capacitor. A control electrode of the twelfth transistor is coupled to the pull-up node, a first electrode of the twelfth transistor is coupled to the signal output terminal, and a second electrode of the twelfth transistor is coupled to the second clock signal input terminal. The first capacitor is coupled between the pull-up node and the signal output terminal.

In an embodiment of the present disclosure, the pull-down circuit includes an eighth transistor and an eleventh transistor. A control electrode of the eighth transistor is coupled to the pull-down node, a first electrode of the eighth transistor is coupled to the first voltage terminal, and a second electrode of the eighth transistor is coupled to the pull-up node. A control electrode of the eleventh transistor is coupled to the pull-down node, a first electrode of the eleventh transistor is coupled to the first voltage terminal, and a second electrode of the eleventh transistor is coupled to the signal output terminal.

Another aspect of the present disclosure provides a method for driving a shift register unit. The method includes turning on a first input circuit according to a first input signal from a first signal input terminal, so as to provide a first control signal from a first signal control terminal to a pull-up node, turning on a control circuit according to the first control signal and a first clock signal from a first clock signal input terminal, so as to provide the first input signal to the pull-up node, and turning on an output circuit according to the voltage of the pull-up node, so as to output a second clock signal from a second clock signal input terminal to a signal output terminal, maintaining the voltage of the pull-up node to keep the output circuit turned on, so as to output the second clock signal to the signal output terminal, and controlling the voltage of a pull-down node by a pull-down control circuit according to the voltage of the pull-up node, and turning on a second input circuit according to a second input signal from a second signal input terminal, so as to provide a second control signal from a second signal control terminal to the pull-up node to turn off the output circuit, and providing the first clock signal to the pull-down node according to the first clock signal to turn on a pull-down circuit, so as to provide the voltage of a first voltage terminal to the pull-up node and the signal output terminal.

In an embodiment of the present disclosure, the method further includes turning on a second input circuit according to the second input signal, so as to provide the second control signal to the pull-up node, turning on the control circuit according to the second control signal and the first clock signal, so as to provide the first input signal to the pull-up node, and turning on the output circuit according to the voltage of the pull-up node, so as to output the second clock signal to the signal output terminal, maintaining the voltage of the pull-up node to keep the output circuit turned on, so as to output the second clock signal to the signal output terminal, and controlling the voltage of the pull-down node by the pull-down control circuit according to the voltage of the pull-up node, and turning on the first input circuit according to the first input signal from the first signal input terminal, so as to provide the first control signal from the first signal control terminal to the pull-up node to turn off the output circuit, and providing the first clock signal to the pull-down node according to the first clock signal, so as to turn on the pull-down circuit to provide the voltage of the first voltage terminal to the pull-up node and the signal output terminal.

Another aspect of the present disclosure provides a gate driving device including a plurality of cascaded shift register units, wherein the shift register unit is any one of the abovementioned shift register units. A signal output terminal of the shift register unit at each stage is coupled to a first signal input terminal of the shift register unit at the next stage, and a second signal input terminal of the shift register unit at each stage is coupled to a signal output terminal of the shift register unit at the next stage.

Another aspect of the present disclosure provides an array substrate including the abovementioned gate driving device.

Another aspect of the present disclosure provides a display device including the abovementioned array substrate.

Another aspect of the present disclosure further provides an electronic device including the abovementioned display device.

BRIEF DESCRIPTION OF THE DRAWINGS

In order to illustrate the technical solution of the present disclosure more clearly, the drawings of the embodiments will be briefly described below. It should be appreciated that the drawings described below are merely some of the embodiments of the disclosure, rather than restricting the scope of the disclosure, in which:

FIG. 5 is a timing diagram of signals of a shift register unit according to an embodiment of the present disclosure;

FIG. 6 is a schematic flow chart of a method for driving a shift register unit according to an embodiment of the present disclosure;

DETAILED DESCRIPTION

In order to make the technical solutions and advantages of the embodiments of the present disclosure clearer, the technical solutions of the embodiments of the present disclosure will be clearly and completely described below with reference to the accompanying drawings. Obviously, the described embodiments are only a part rather than all of the embodiments of the present disclosure. All other embodiments obtained by those of ordinary skill in the art based on the described embodiments without creative efforts shall also fall within the scope of the present disclosure.

Figure 1:
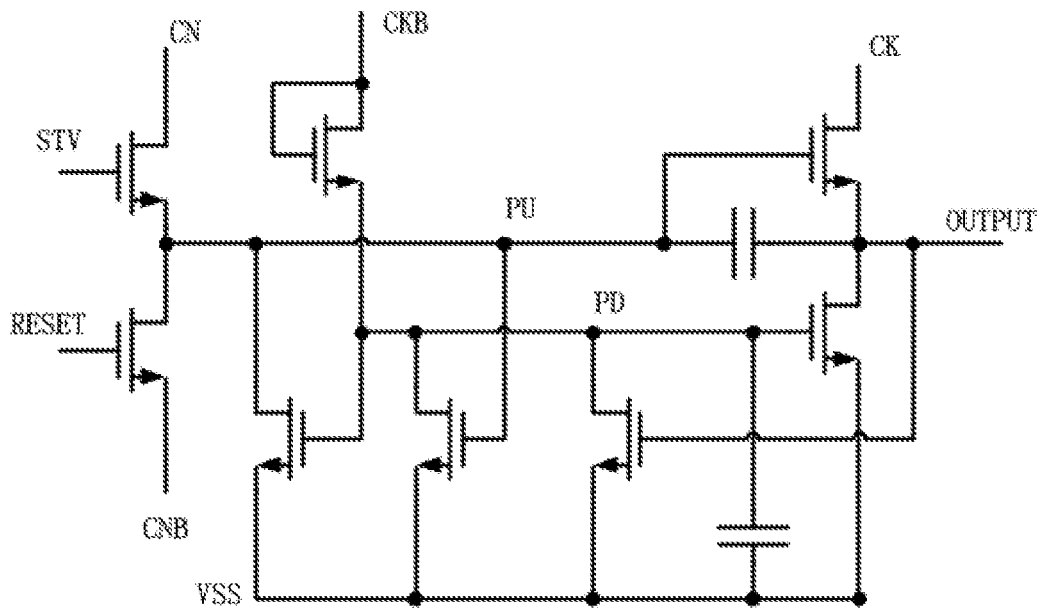
FIG. 1 is a circuit diagram of a shift register unit.

FIG. 1 shows a circuit diagram of a shift register unit 8T2C. The GOA circuit of the 8T2C can be applied to a touch display panel. After a touch is ended, the PU node of the GOA at the stage that needs to be activated is charged by only one TFT during the Touch stage, to become a high level, while due to the electric leakage of the PU node, the PU node of the GOA at the stage that needs to be activated The PU node level of the GOA that needs to be activated after a Touch is ended will become lower, resulting in the problem of insufficient charging of TFTs in the pixel region.

The shift register unit and the driving method thereof, the gate driving device, the array substrate, the display device and the electronic device provided according to the embodiments of the present disclosure are described below with reference to the accompanying drawings.

Figure 2:
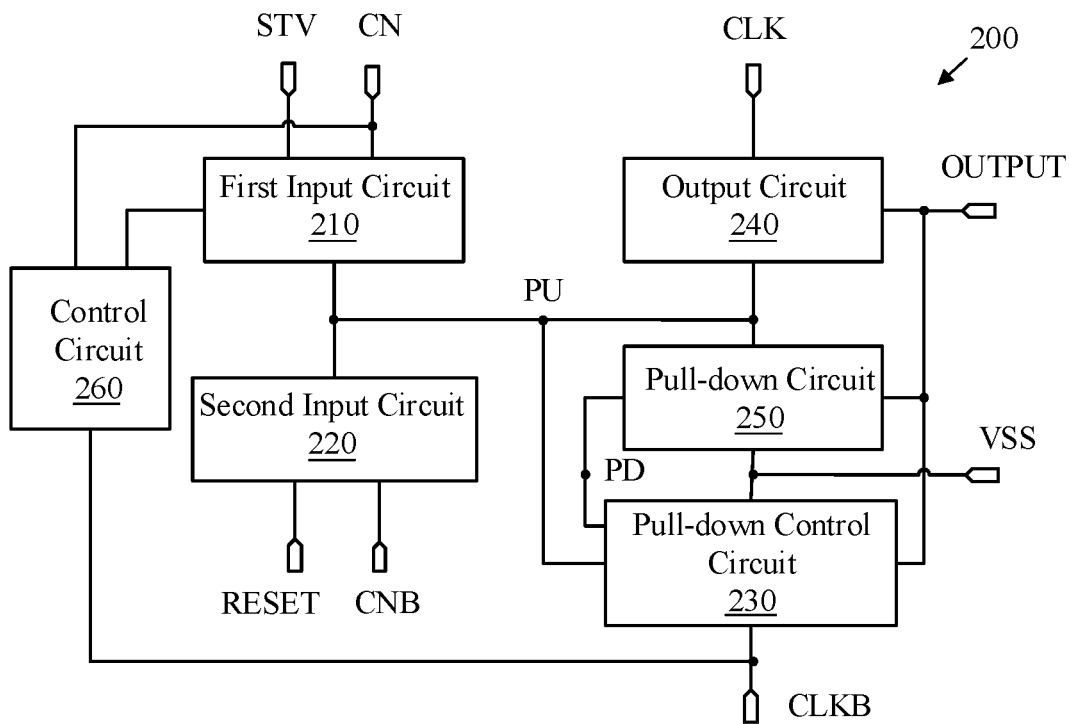
FIG. 2 is a schematic block diagram of a shift register unit according to an embodiment of the disclosure.

As shown in FIG. 2, the shift register unit 200 provided in the embodiment of the present disclosure includes a first input circuit 210, a second input circuit 220, a pull-down control circuit 230, an output circuit 240, a pull-down circuit 250, and a control circuit 260.

The first input circuit 210 is coupled to a first signal input terminal STV, a first signal control terminal CN, and a pull-up node PU. The first input circuit 210 may provide a first control signal from the first signal control terminal CN to the pull-up node PU under the control of a first input signal from the first signal input terminal STV.

The second input circuit 220 is coupled to a second signal input terminal RESET, a second signal control terminal CNB, and the pull-up node PU. The second input circuit 220 may provide a second control signal from the second signal control terminal CNB to the pull-up node PU under the control of a second input signal from the second signal input terminal RESET.

The pull-down control circuit 230 is coupled to the first clock signal input terminal CLKB, the pull-up node PU, a pull-down node PD, a first voltage terminal VSS, and a signal output terminal OUTPUT. The pull-down control circuit 230 may provide the voltage of the first voltage terminal VSS to the pull-down node PD under the control of the voltage of the pull-up node PU. The pull-down control circuit 230 may also provide the voltage of the first voltage terminal VSS to the pull-down node PD under the control of an output signal of the signal output terminal OUTPUT. In addition, the pull-down control circuit 230 may store the voltage of the second clock signal terminal CLKB, and provide a first clock signal to the pull-down node PD under the control of the first clock signal from the first clock signal input terminal CLKB, or discharge the stored voltage to the pull-down node PD so as to control the voltage of the pull-down node PD.

The output circuit 240 is coupled to the pull-up node PU, a second clock signal input terminal CLK, and the signal output terminal OUTPUT. The output circuit 240 may provide a second clock signal from the second clock signal input terminal CLK to the signal output terminal OUTPUT as an output signal under the control of the voltage of the pull-up node PU.

The pull-down circuit 250 is coupled to the first voltage terminal VSS, the pull-down node PD, the pull-up node PU, and the signal output terminal OUTPUT. The pull-down circuit 250 may provide the voltage of the first voltage terminal VSS to the pull-up node PU and the signal output terminal OUTPUT under the control of the voltage of the pull-down node PD.

The control circuit 260 is coupled to the first signal control terminal CN, the first signal input terminal STV, the first clock signal input terminal CLKB, and the pull-up node PU. The control circuit 260 may provide the first input signal to the pull-up node PU under the control of the first control signal and the first clock signal.

Figure 3:
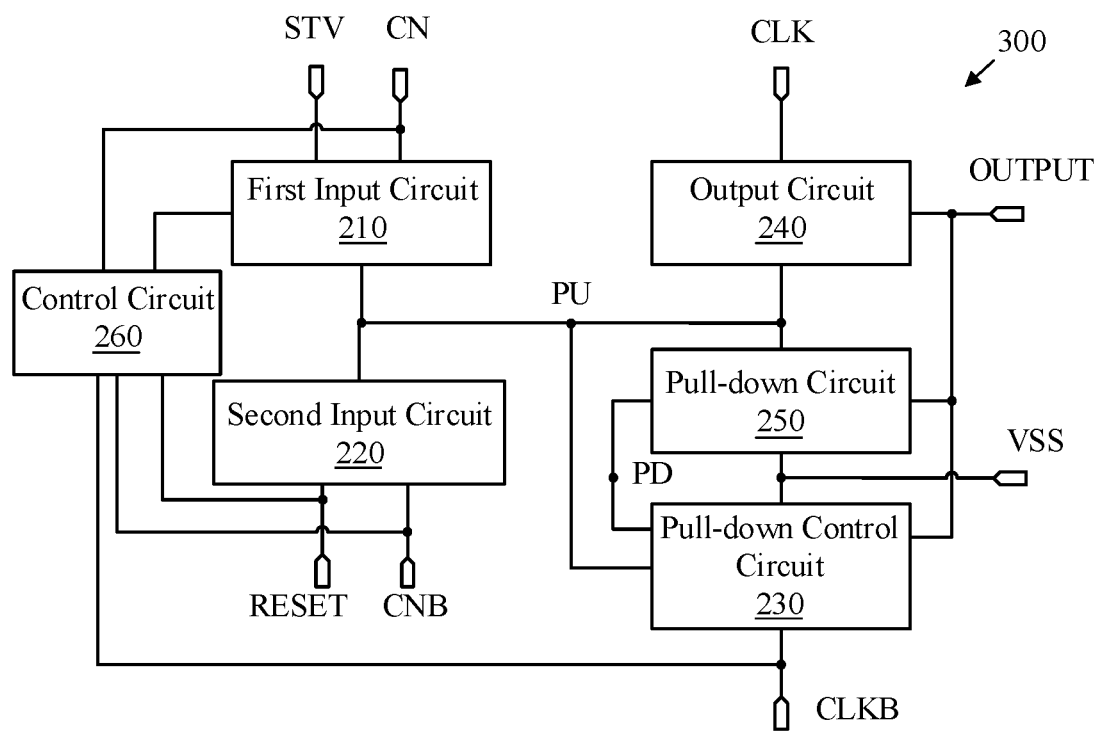
FIG. 3 is an exemplary block diagram of a shift register unit according to an embodiment of the disclosure.

FIG. 3 shows a schematic block diagram of a shift register unit 300 according to another embodiment of the present disclosure. The first input circuit 210, the second input circuit 220, the pull-down control circuit 230, the output circuit 240, and the pull-down circuit 250 in the shift register unit 300 are the same as the first input circuit 210, the second input circuit 220, the pull-down control circuit 230, the output circuit 240, and the pull-down circuit 250 described above in combination with FIG. 2. In addition to having the structure of the control circuit 260 in FIG. 2, the control circuit 260 in the shift register unit 300 is also coupled to the second signal control terminal CNB, the second signal input terminal RESET, the first clock signal input terminal CLKB, and the pull-up node PU. The control circuit 260 may further provide the second input signal to the pull-up node PU under the control of the second control signal and the first clock signal.

Figure 4:
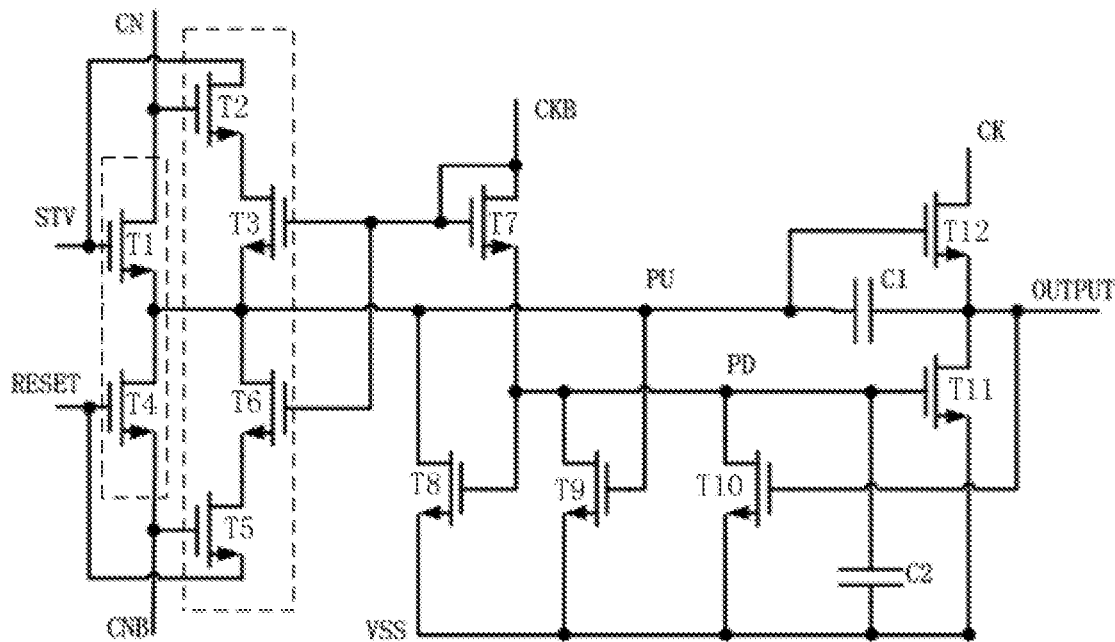
FIG. 4 is an exemplary circuit diagram of a shift register unit according to another embodiment of the present disclosure.

FIG. 4 shows an exemplary circuit diagram of the shift register unit 300 shown in FIG. 3. In an embodiment, the transistor used may be an N-type transistor or a P-type transistor. Specifically, the transistor may be an N-type or P-type field effect transistor (MOSFET), or an N-type or P-type bipolar transistor (BJT). In an embodiment of the disclosure, a gate of the transistor is called the control electrode. As a source and a drain of the transistor are symmetrical, the source and the drain are not distinguished. That is, the source of the transistor may be the first electrode (or the second electrode) and the drain thereof may be the second electrode (or the first electrode). Further, the function of the transistor may be implemented using any controlled switching device having a gate signal input, and the controlled middle terminal of the switching device for receiving a control signal (e.g., for turning on and off the controlled switching device) is referred to as the control electrode, whilst the other two terminals are respectively the first electrode and the second electrode. Hereinafter, an N-type field effect transistor (NMOS) will be described in detail as an example.

As shown in FIG. 4, the first input circuit 210 includes a first transistor T1. A control electrode of the first transistor T1 is coupled to the first signal input terminal STV. A first electrode of the first transistor T1 is coupled to the pull-up node PU, and a second electrode of the first transistor T1 is coupled to the first signal control terminal CN.

The second input circuit 220 includes a fourth transistor T4. A control electrode of the fourth transistor T4 is coupled to the second signal input terminal RESET, a first electrode of the fourth transistor T4 is coupled to the second signal control terminal CNB, and a second electrode of the fourth transistor T4 is coupled to the pull-up node PU.

The pull-down control circuit 230 includes a seventh transistor T7, a ninth transistor T9, a tenth transistor T10, and a second capacitor C2. A control electrode and a second electrode of the seventh transistor T7 are coupled to the first clock signal input terminal CLKB, and a first electrode of the seventh transistor T7 is coupled to the pull-down node PD. A control electrode of the ninth transistor T9 is coupled to the pull-up node PU, a first electrode of the ninth transistor T9 is coupled to the first voltage terminal VSS, and a second electrode of the ninth transistor T9 is coupled to the pull-down node PD. A control electrode of the tenth transistor T10 is coupled to the signal output terminal OUTPUT, a first electrode of the tenth transistor T10 is coupled to the first voltage terminal VSS, and a second electrode of the tenth transistor T10 is coupled to the pull-down node PD. A second capacitor C2 is coupled between the pull-down node PD and the first voltage terminal VSS.

The output circuit 240 includes a twelfth transistor T12 and a first capacitor C1. A control electrode of the twelfth transistor T12 is coupled to the pull-up node PU, a first electrode of the twelfth transistor T12 is coupled to the signal output terminal OUTPUT, and a second electrode of the twelfth transistor T12 is coupled to the second clock signal input terminal CLK. The first capacitor C1 is coupled between the pull-up node PU and the signal output terminal OUTPUT.

The pull-down circuit 250 includes an eighth transistor T8 and an eleventh transistor T11. A control electrode of the eighth transistor T8 is coupled to the pull-down node PD, a first electrode of the eighth transistor T8 is coupled to the first voltage terminal VSS, and a second electrode of the eighth transistor T8 is coupled to the pull-up node PU. A control electrode of the eleventh transistor T11 is coupled to the pull-down node PD, a first electrode of the eleventh transistor T11 is coupled to the first voltage terminal VSS, and a second electrode of the eleventh transistor T11 is coupled to the signal output terminal OUTPUT.

The control circuit 260 includes a second transistor T2 and a third transistor T3. A control electrode of the second transistor T2 is coupled to the first signal control terminal CN, a first electrode of the second transistor T2 is coupled to the second electrode of the third transistor T3, and a second electrode of the second transistor T2 is coupled to the first signal input terminal STV. A control electrode of the third transistor T3 is coupled to the first clock signal input terminal CLKB, a first electrode of the third transistor T3 is coupled to the pull-up node PU, and a second electrode of the third transistor T3 is coupled to the first electrode of the second transistor T2.

Further, the control circuit 260 further includes a fifth transistor T5 and a sixth transistor T6. A control electrode of the fifth transistor T5 is coupled to the second signal control terminal CNB, a first electrode of the fifth transistor T5 is coupled to the second signal input terminal RSEST, and a second electrode of the fifth transistor T5 is coupled to the first electrode of the sixth transistor T6. A control electrode of the sixth transistor T6 is coupled to the first clock signal input terminal CLKB, a first electrode of the sixth transistor T6 is coupled to the second electrode of the fifth transistor T5, and a second electrode of the sixth transistor T6 is coupled to the pull-up node PU.

The operation process of the shift register unit shown in FIG. 4 will be described in detail below with reference to the timing diagram shown in FIG. 5. In the following description, all the transistors in the shift register unit are N-type transistors. The voltage of the first voltage terminal VSS is at a low level. During forward scanning, the first signal control terminal CN provides a first control signal at a high level and the second signal control terminal CNB provides a second control signal at a low level.

At time t1, the first input signal provided by the first signal input terminal STV is at a high level, the first clock signal provided by the first clock signal input terminal CKB is at a high level, and the second clock signal provided by the second clock signal input terminal CK is at a low level. The first transistor T1 is turned on, and the second transistor T2 and the third transistor T3 are turned on. The high level provided by the first signal control terminal CN is outputted to the pull-up node PU through the first transistor T1 to charge the first capacitor C1, and is also outputted to the pull-up node PU through the second transistor T2 and the third transistor T3 to charge the first capacitor C1. The voltage of the pull-up node PU becomes a high level, the twelfth transistor T12 is turned on. As the second clock signal provided by the second clock signal input terminal CK is at a low level, the signal output terminal OUTPUT outputs a low level.

At time t2, the first clock signal provided by the first clock signal input terminal CKB is at a low level and the second clock signal provided by the second clock signal input terminal CK is at a high level. Through the first capacitor C1, the voltage of the pull-up node PU is further increased due to bootstrapping, that is, the first capacitor C1 performs voltage bootstrapping on the pull-up node PU to keep the pull-up node PU at a high level. The twelfth transistor T12 remains turned on. The signal output terminal OUTPUT outputs a high level. The ninth transistor T9 and the tenth transistor T10 are turned on, providing the voltage of the first voltage terminal VSS to the pull-down node PD. Therefore, the pull-down node PD is at a low level.

At time t3, the first clock signal provided by the first clock signal input terminal CKB is at a low level and the second clock signal provided by the second clock signal input terminal CK is at a low level. The pull-up node PU is lowered due to bootstrapping, but is still at a high level. That is, the pull-up node PU remains at a high level. The twelfth transistor T12 is turned on. The second clock signal CK is at a low level, so that the signal output terminal OUTPUT outputs a low level. The ninth transistor T9 is turned on, to keep the pull-down node PD at a low level.

At time t4, the second input signal provided by the second signal input terminal RESET is at a high level, the first clock signal provided by the first clock signal input terminal CKB is at a high level, and the second signal provided by the second clock signal input terminal CK is at a low level. As the input signal provided by the second signal input terminal RESET is at a high level and the fourth transistor T4 is turned on, the voltage of the pull-up node PU is pulled down to a low level, and the ninth transistor T9 is turned off. The seventh transistor T7 is turned on, and the pull-down node PD becomes a high level. The eleventh transistor T11 is turned on, and the signal output terminal OUTPUT outputs a low level.

In an embodiment of the present disclosure, as shown in FIG. 5, when the first clock signal provided by the first clock signal input terminal CKB is at a high level, the second clock signal provided by the second clock signal input terminal CK is at a low level. When the second clock signal provided by the second clock signal input terminal CK is at a high level, the first clock signal provided by the first clock signal input terminal CKB is at a low level.

On the other hand, during reverse scanning, the first signal control terminal CN provides a first control signal at a low level, and the second signal control terminal CNB provides a second control signal at a high level. The working process of reverse scanning is similar to that of forward scanning, which is described in detail below.

At time t1, a second input signal at a high level is provided at the second signal input terminal RESET. The fourth transistor T4 is turned on, the fifth transistor T5 and the sixth transistor T6 are turned on. The high level provided by the second signal control terminal CNB is outputted to the pull-up node PU through the fourth transistor T4 to charge the first capacitor C1, and is also outputted to the pull-up node PU through the fifth transistor T5 and the sixth transistor T6 to charge the first capacitor C1. The voltage of the pull-up node PU becomes a high level, the twelfth transistor T12 is turned on. As the second clock signal is at a low level, the signal output terminal OUTPUT outputs a low level.

During reverse scanning, the working processes at time t2 and time t3 are the same as the working processes at times t2 and t3 during forward scanning, which will not be repeated here.

At time t4, a first input signal at a high level is provided at the first signal input STV. The first transistor T1 is turned on, the voltage of the pull-up node PU is pulled down to a low level, and the ninth transistor T9 is turned off. The seventh transistor T7 is turned on, and the pull-down node PD becomes a high level. The eleventh transistor T11 is turned on, and the signal output terminal OUTPUT outputs a low level.

In an embodiment of the present disclosure, the first capacitor C1 functions to bootstrap the voltage of the pull-up node PU, and the second capacitor C2 functions to stabilize the voltage of the pull-down node PD and reduce noises to the voltage of the pull-down node PD. When the shift register unit outputs a signal, during forward scanning, the first capacitor C1 may be charged by the transistors T1 and T2 and T3 to increase the voltage of the pull-up node PU. Moreover, during reverse scanning, the first capacitor C1 may be charged by the transistors T4 and T5 and T6 to increase the voltage of the pull-up node PU. The voltage of the pull-up node PU is higher, compared with the shift register unit charged only by one transistor in FIG. 1. Therefore, it solves the problem of insufficient charging of transistors in the pixel region. When the shift register unit does not output a signal, during forward scanning, the pull-up node PU can be pulled down to a low level by the transistors T2 and T3 to accelerate the discharging of the pull-up node PU. Moreover, during reverse scanning, the pull-up node PU can be pulled down to a low level by the transistors T5 and T6 to accelerate the discharging of the pull-up node PU. Therefore, it is possible to realize a quick response of a touch panel with a Touch function.

FIG. 6 is a schematic flow chart of a method for driving a shift register unit according to an embodiment of the present disclosure.

As shown in FIG. 6, during forward scanning, first, in step S610, the first input circuit is turned on according to the first input signal from the first signal input terminal, so as to provide the first control signal from the first signal control terminal to the pull-up node. The control circuit is turned on according to the first control signal and the first clock signal from the first clock signal input terminal, so as to provide the first input signal to the pull-up node. Moreover, the output circuit is turned on according to the voltage of the pull-up node, so as to output the second clock signal from the second clock signal input terminal to the signal output terminal.

In step S620, the voltage of the pull-up node is maintained to keep the output circuit turned on, so as to output the second clock signal to the signal output terminal. The voltage of the pull-down node is controlled by the pull-down control circuit according to the voltage of the pull-up node.

Next, in step S630, the second input circuit is turned on according to the second input signal from the second signal input terminal, so as to provide the second control signal from the second signal control terminal to the pull-up node to turn off the output circuit. The first clock signal is provided to the pull-down node according to the first clock signal to turn on the pull-down circuit, so as to provide the voltage of the first voltage terminal to the pull-up node and the signal output terminal.

In an embodiment of reverse scanning, in step S610, the second input circuit is turned on according to the second input signal, so as to provide the second control signal to the pull-up node. The control circuit is turned on according to the second control signal and the first clock signal, so as to provide the first input signal to the pull-up node. Then the output circuit is turned on according to the voltage of the pull-up node, so as to output the second clock signal to the signal output terminal.

In step S620, the voltage of the pull-up node is maintained to keep the output circuit turned on, so as to output the second clock signal to the signal output terminal. The voltage of the pull-down node is controlled by the pull-down control circuit according to the voltage of the pull-up node.

In step S630, the first input circuit is turned on according to the first input signal from the first signal input terminal, so as to provide the first control signal from the first signal control terminal to the pull-up node to turn off the output circuit. According to the first clock signal, the first clock signal is provided to the pull-down node to turn on the pull-down circuit, so as to provide the voltage of the first voltage terminal to the pull-up node and the signal output terminal.

Figure 7:
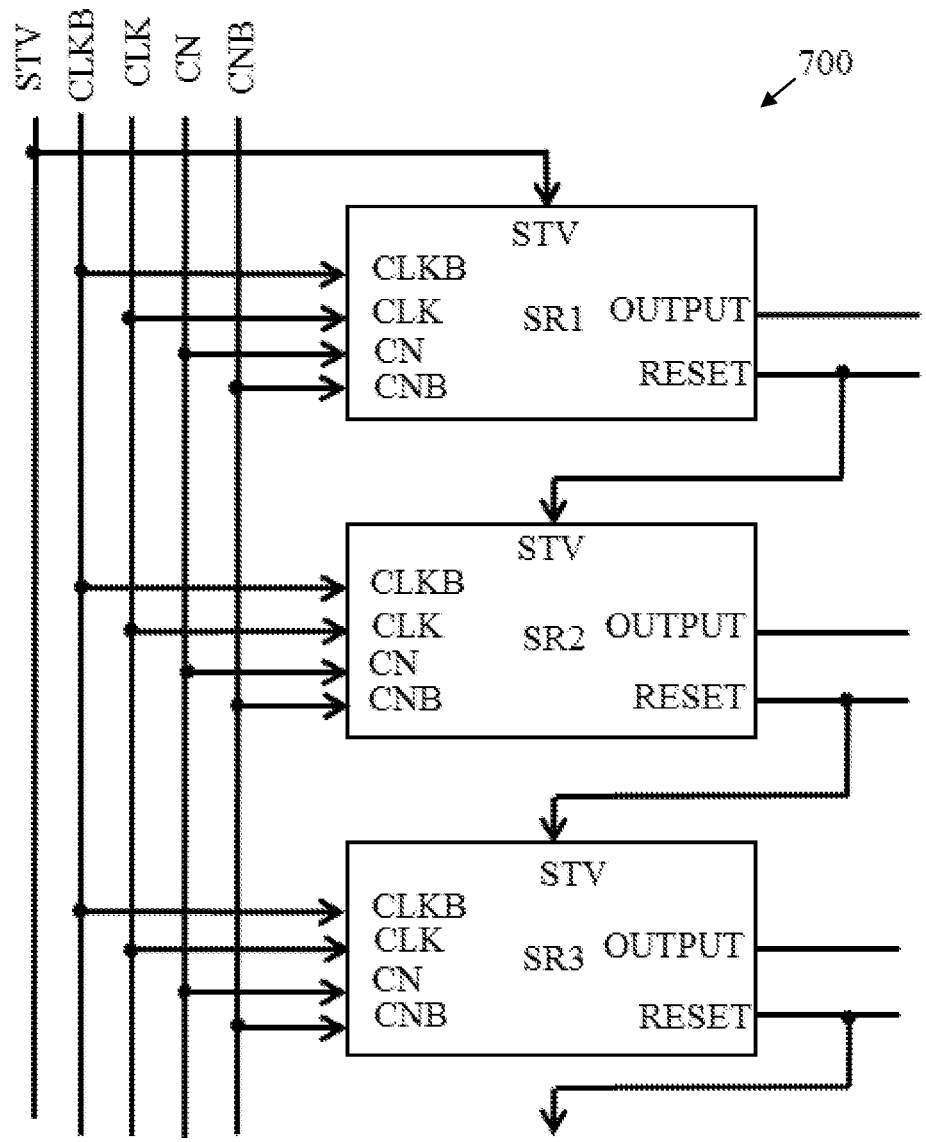
FIG. 7 is a schematic diagram of a gate driving circuit according to an embodiment of the present disclosure.

FIG. 7 shows a schematic structural diagram of a gate driving circuit 700 according to an embodiment of the present disclosure. As shown in FIG. 7, the gate driving circuit 700 may include a plurality of cascaded shift register units SR1, SR2, . . . , SRn, SR (n+1), . . . . The shift register unit at each stage may adopt the structure of the shift register unit 200 or 300 as described above.

In the gate driving circuit 700, the ports of the shift register unit at each stage may include a first signal input terminal STV, a first signal control terminal CN, a second signal input terminal RESET, a second signal control terminal CNB, a first clock signal input terminal CLKB, a second clock signal input terminal CLK, a first voltage signal terminal VSS, and a signal output terminal OUTPUT.

The signal output terminal OUTPUT of the shift register SRn at each stage is coupled to the first signal input terminal STV of the shift register SR (n+1) at the next stage, and the second signal input terminal RESET of the shift register SRn at each stage is coupled to the signal output terminal OUTPUT of the shift register SR (n+1) at the next stage. For example, the second signal input terminal RESET of the shift register SR1 at the first stage receives the output signal from the signal output terminal OUTPUT of the shift register SR2 at the second stage, as the second input signal RESET of the shift register SR1 at the first stage (i.e., reset signal). The first signal input terminal STV of the shift register SR2 at the second stage receives the output signal from the signal output terminal OUTPUT of the shift register SR1 at the first stage, as the first signal input terminal STV of the shift register SR1 at the second stage (i.e., frame start signal).

According to an embodiment of the present disclosure, when the first clock signal provided by the first clock signal input terminal CKB is at a high level, the second clock signal provided by the second clock signal input terminal CK is at a low level. When the second clock signal provided by the second clock signal input terminal CK is at a high level, the first clock signal provided by the first clock signal input terminal CKB is at a low level.

Figure 8:
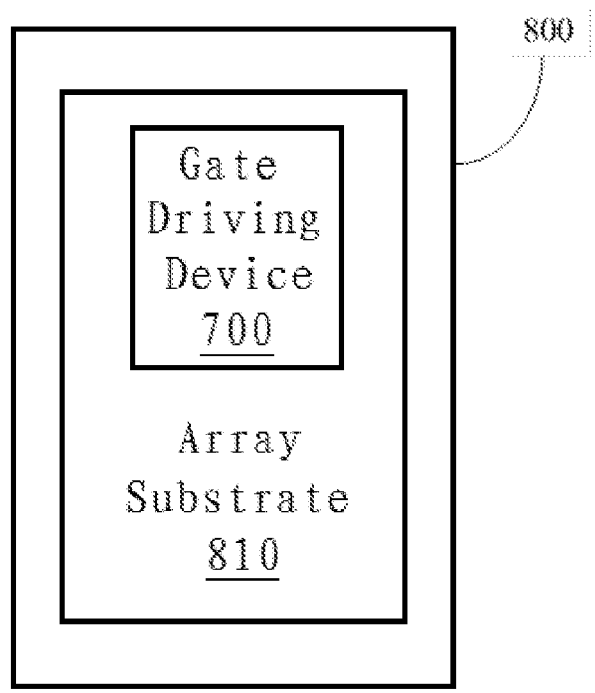
FIG. 8 is a schematic block diagram of a touch display device according to an embodiment of the present disclosure.

As shown in FIG. 8, there is further provided a display device 800 in an embodiment of the present disclosure. The display device 800 includes an array substrate 810. The array substrate 810 the gate driving device 700 described in the foregoing embodiment.

The display device 800 may be a display panel with a Touch function or other devices with a touch display function.

The display device according to the embodiments of the present disclosure, by means of the gate driving device described above, can effectively increase the voltage of the pull-up node PU of the shift register unit GOA at the stage that needs to be activated after a Touch is ended. Thus, it can avoid that the voltage of the pull-up node PU of the shift register unit GOA at the stage that needs to be activated after the Touch is ended is low due to the electric leakage of the pull-up node PU. It prevents insufficient charging of TFTs in the pixel region because of the voltage of the pull-up node PU becoming low. Therefore, it can ensure touch display effects and meet users' needs.

Figure 9:
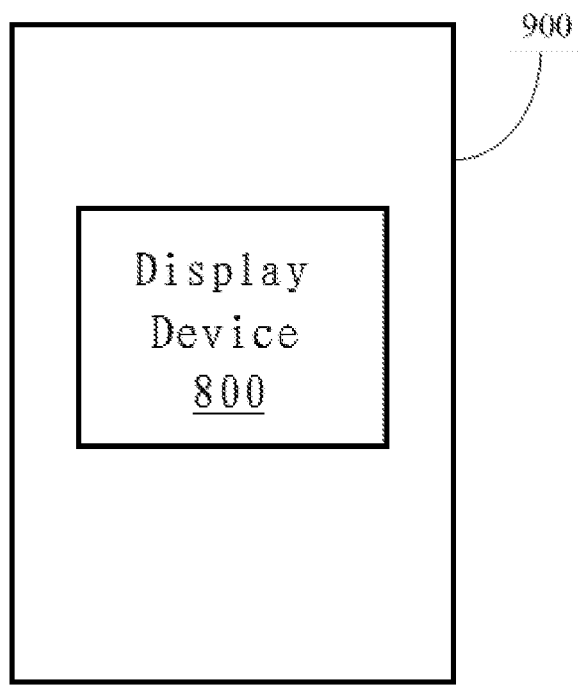
FIG. 9 is a schematic block diagram of a touch electronic device according to an embodiment of the present disclosure.

In addition, as shown in FIG. 9, there is further provided an electronic device 900 in an embodiment of the present disclosure. The electronic device 900 includes the display device 800 described above. The electronic device 900 may be, for example, a mobile phone with a touch display screen, a tablet computer, a display screen, or a wearable device.

The electronic device according to the embodiment of the present disclosure adopting the display device described above, has a good touch display effect and fast response, improving user experience.

In addition, the terms "first" and "second" are merely for descriptive purposes and are not to be construed as indicating or implying relative importance or implicitly specifying the number of indicated technical features. Thus, a feature defined with "first" and "second" may explicitly or implicitly include at least one said feature. In the description of the present disclosure, "a plurality of" means at least two, for example, two, three, etc., unless expressly limited otherwise.

In this disclosure, the terms "coupled", "connected" and the like should be broadly understood, unless expressly stated and limited otherwise. For example, a direct connection may be referred to, and an indirect connection via an intermediate medium may also be referred to, unless explicitly stated otherwise. For those skilled in the art, the specific meanings of the abovementioned terms in the present disclosure may be understood as the case may be.

In the present disclosure, unless expressly stated and limited otherwise, a first feature being "on" or "down" to a second feature may be the first and second features being in direct contact with each other, or may be the first and second features being in indirect contact with each other via an intermediate medium. Furthermore, the first feature being "on", "above" and "on top of" the second feature may be the first feature being directly above or obliquely above the second feature, or may simply indicate that the first feature level is higher than the second feature. The first feature being "below", "under" and "below" the second feature may be the first directly being right below or obliquely below the second feature, or may simply indicate that the first feature level is lower than the second feature.

In the description of the specification, the description of the reference terms "one embodiment", "some embodiments", "an example", "a specific example", or "some examples" mean that a specific feature, structure, material, or characteristics described in combination with the embodiment or example are included in at least one embodiment or example of the present disclosure. In the present specification, a schematic expression of the abovementioned terms does not necessarily refer to the same embodiment or example. Furthermore, the particular feature, structure, material, or characteristics described may be combined in any suitable manner in any one or more of the embodiments or examples. In addition, different embodiments or examples described in this specification and features of different embodiments or examples may be combined and incorporated by those skilled in the art without mutual contradiction.

Although the embodiments of the disclosure have been shown and described above, it should be understood that the abovementioned embodiments are merely exemplary and should not be construed as limiting the disclosure. Those of ordinary skill in the art may change, alter, replace, and modify the embodiments within the scope of the disclosure.

What is claimed is:

1. A shift register unit comprising:
    a first input circuit, configured to provide a first control signal from a first signal control terminal to a pull-up node according to a first input signal from a first signal input terminal;
    a second input circuit, configured to provide a second control signal from a second signal control terminal to the pull-up node according to a second input signal from a second signal input terminal;
    a pull-down control circuit, configured to provide a voltage of a first voltage terminal to a pull-down node according to a voltage of the pull-up node, or to control a voltage of the pull-down node according to a first clock signal from a first clock signal input terminal;
    an output circuit, configured to provide a second clock signal from a second clock signal input terminal to a signal output terminal as an output signal according to the voltage of the pull-up node;
    a pull-down circuit, configured to provide the voltage of the first voltage terminal to the pull-up node and the signal output terminal according to the voltage of the pull-down node; and
    a control circuit, configured to provide the first input signal to the pull-up node according to the first control signal and the first clock signal;
    wherein the pull-down control circuit comprises a first transistor, a second transistor, a third transistor, and a first capacitor;
    wherein a control electrode and a second electrode of the first transistor are coupled to the first clock signal input terminal, and a first electrode of the first transistor is coupled to the pull-down node;
    wherein a control electrode of the second transistor is coupled to the pull-up node, a first electrode of the second transistor is coupled to the first voltage terminal, and a second electrode of the second transistor is coupled to the pull-down node;
    wherein a control electrode of the third transistor is coupled to the signal output terminal, a first electrode of the third transistor is coupled to the first voltage terminal, and a second electrode of the third transistor is coupled to the pull-down node; and
    wherein the first capacitor is coupled between the pull-down node and the first voltage terminal.

2. The shift register unit according to claim 1,
    wherein the control circuit comprises a fourth transistor and a fifth transistor;
    wherein a control electrode of the fourth transistor is coupled to the first signal control terminal, a first electrode of the fourth transistor is coupled to the second electrode of the fifth transistor, and a second electrode of the fourth transistor is coupled to the first signal input terminal; and
    wherein a control electrode of the fifth transistor is coupled to the first clock signal input terminal, a first electrode of the fifth transistor is coupled to the pull-up node, and a second electrode of the fifth transistor is coupled to the first electrode of the fourth transistor.

3. The shift register unit according to claim 1, wherein the control circuit is further configured to provide the second input signal to the pull-up node according to the second control signal and the first clock signal.

4. The shift register unit according to claim 3,
    wherein the control circuit comprises a sixth transistor and a seventh transistor;
    wherein a control electrode of the sixth transistor is coupled to the second signal control terminal, a first electrode of the sixth transistor is coupled to the second signal input terminal, and a second electrode of the sixth transistor is coupled to the first electrode of the seventh transistor; and wherein a control electrode of the seventh transistor is coupled to the first clock signal input terminal, a first electrode of the seventh transistor is coupled to the second electrode of the sixth transistor, and a second electrode of the seventh transistor is coupled to the pull-up node.

5. The shift register unit according to claim 1,
wherein the first input circuit comprises an eighth transistor; and
wherein a control electrode of the eighth transistor is coupled to the first signal input terminal, a first electrode of the eighth transistor is coupled to the pull-up node, and a second electrode of the eighth transistor is coupled to the first signal control terminal.

6. The shift register unit according to claim 1,
wherein the second input circuit comprises a ninth transistor; and
wherein a control electrode of the ninth transistor is coupled to the second signal input terminal, a first electrode of the ninth transistor is coupled to the second signal control terminal, and a second electrode of the ninth transistor is coupled to the pull-up node.

7. The shift register unit according to claim 1,
wherein the output circuit comprises a tenth transistor and a second capacitor;
wherein a control electrode of the tenth transistor is coupled to the pull-up node, a first electrode of the tenth transistor is coupled to the signal output terminal, and a second electrode of the tenth transistor is coupled to the second clock signal input terminal; and
wherein the second capacitor is coupled between the pull-up node and the signal output terminal.

8. The shift register unit according to claim 1,
wherein the pull-down circuit comprises an eleventh transistor and a twelfth transistor;
wherein a control electrode of the eleventh transistor is coupled to the pull-down node, a first electrode of the eleventh transistor is coupled to the first voltage terminal, and a second electrode of the eleventh transistor is coupled to the pull-up node; and
wherein a control electrode of the twelfth transistor is coupled to the pull-down node, a first electrode of the twelfth transistor is coupled to the first voltage terminal, and a second electrode of the twelfth transistor is coupled to the signal output terminal.

9. A method for driving a shift register unit, the method comprising:
turning on a first input circuit according to a first input signal from a first signal input terminal to provide a first control signal from a first signal control terminal to a pull-up node, turning on a control circuit according to the first control signal and a first clock signal from a first clock signal input terminal to provide the first input signal to the pull-up node, and turning on an output circuit according to the voltage of the pull-up node to output a second clock signal from a second clock signal input terminal to a signal output terminal;
maintaining the voltage of the pull-up node to keep the output circuit turned on to output the second clock signal to the signal output terminal, and controlling the voltage of a pull-down node by a pull-down control circuit according to the voltage of the pull-up node;
turning on a second input circuit according to a second input signal from a second signal input terminal to provide a second control signal from a second signal control terminal to the pull-up node to turn off the output circuit, and providing the first clock signal to the pull-down node according to the first clock signal to turn on a pull-down circuit to provide the voltage of a first voltage terminal to the pull-up node and the signal output terminal;
turning on a second input circuit according to the second input signal to provide the second control signal to the pull-up node, turning on the control circuit according to the second control signal and the first clock signal to provide the first input signal to the pull-up node, and turning on the output circuit according to the voltage of the pull-up node to output the second clock signal to the signal output terminal;
maintaining the voltage of the pull-up node to keep the output circuit turned on to output the second clock signal to the signal output terminal, and controlling the voltage of the pull-down node by the pull-down control circuit according to the voltage of the pull-up node; and
turning on the first input circuit according to the first input signal to provide the first control signal to the pull-up node to turn off the output circuit, and providing the first clock signal to the pull-down node according to the first clock signal to turn on the pull-down circuit to provide the voltage of the first voltage terminal to the pull-up node and the signal output terminal.

10. A gate driving device, comprising a plurality of cascaded shift register units, wherein the shift register unit at each stage is the shift register unit according to claim 1, wherein a signal output terminal of the shift register unit at each stage is coupled to a first signal input terminal of the shift register unit at the next stage, and wherein a second signal input terminal of the shift register unit at each stage is coupled to a signal output terminal of the shift register unit at the next stage.

11. An array substrate comprising the gate driving device according to claim 10.

12. A display device comprising the array substrate according to claim 11.

13. An electronic device comprising the display device according to claim 12.

14. The gate driving device according to claim 10,
wherein the control circuit comprises a fourth transistor and a fifth transistor;
wherein a control electrode of the fourth transistor is coupled to the first signal control terminal, a first electrode of the fourth transistor is coupled to the second electrode of the fifth transistor, and a second electrode of the fourth transistor is coupled to the first signal input terminal; and
wherein a control electrode of the fifth transistor is coupled to the first clock signal input terminal, a first electrode of the fifth transistor is coupled to the pull-up node, and a second electrode of the fifth transistor is coupled to the first electrode of the fourth transistor.

15. The gate driving device according to claim 10, wherein the control circuit is further configured to provide the second input signal to the pull-up node according to the second control signal and the first clock signal.

16. The gate driving device according to claim 15,
wherein the control circuit comprises a sixth transistor and a seventh transistor;
wherein a control electrode of the sixth transistor is coupled to the second signal control terminal, a first electrode of the sixth transistor is coupled to the second signal input terminal, and a second electrode of the sixth transistor is coupled to the first electrode of the seventh transistor; and wherein a control electrode of the seventh transistor is coupled to the first clock signal input terminal, a first electrode of the seventh transistor is coupled to the second electrode of the sixth transistor, and a second electrode of the seventh transistor is coupled to the pull-up node.

17. The gate driving device according to claim 10, wherein the first input circuit comprises an eighth transistor; and wherein a control electrode of the eighth transistor is coupled to the first signal input terminal, a first electrode of the eighth transistor is coupled to the pull-up node, and a second electrode of the eighth transistor is coupled to the first signal control terminal.

18. The gate driving device according to claim 10, wherein the second input circuit comprises a ninth transistor; and wherein a control electrode of the ninth transistor is coupled to the second signal input terminal, a first electrode of the ninth transistor is coupled to the second signal control terminal, and a second electrode of the ninth transistor is coupled to the pull-up node.

* * * * *